United States Patent
Kim et al.

(10) Patent No.: US 8,653,640 B2
(45) Date of Patent: Feb. 18, 2014

(54) SEMICONDUCTOR PACKAGE APPARATUS

(75) Inventors: Tae-hun Kim, Cheonan-si (KR);
Dae-young Choi, Yeosu-si (KR);
Yang-hoon Ahn, Asan-si (KR); Sun-hye Lee, Cheongju-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/440,817

(22) Filed: Apr. 5, 2012

(65) Prior Publication Data
US 2012/0306075 A1    Dec. 6, 2012

(30) Foreign Application Priority Data
May 31, 2011    (KR) .................... 10-2011-0052394

(51) Int. Cl.
*H01L 23/488*    (2006.01)

(52) U.S. Cl.
USPC .... 257/686; 257/774; 257/780; 257/E23.021; 257/E23.069; 438/109

(58) Field of Classification Search
USPC .......... 257/686, 738, 774, E23.004, E23.021, 257/E23.069, 779, 780; 438/109
See application file for complete search history.

(56) References Cited

U.S. PATENT DOCUMENTS

| | | | | |
|---|---|---|---|---|
| 6,180,881 B1 * | 1/2001 | Isaak | ............... | 174/524 |
| 6,818,989 B2 * | 11/2004 | Higuchi et al. | ............... | 257/738 |
| 6,977,439 B2 * | 12/2005 | Kang et al. | .................... | 257/777 |
| 7,078,821 B2 * | 7/2006 | Matsunami | .................... | 257/780 |
| 7,122,894 B2 * | 10/2006 | Sugimoto et al. | ............. | 257/737 |
| 7,189,593 B2 * | 3/2007 | Lee | ................ | 438/107 |
| 7,259,451 B2 * | 8/2007 | Seng et al. | .................... | 257/686 |
| 7,772,687 B2 * | 8/2010 | Inoue | ............... | 257/686 |
| 8,299,591 B2 * | 10/2012 | Oh et al. | ........................ | 257/686 |
| 2005/0012214 A1 * | 1/2005 | Nakamura et al. | ............ | 257/738 |
| 2005/0029550 A1 * | 2/2005 | Lee et al. | ........................ | 257/202 |
| 2006/0145343 A1 * | 7/2006 | Lee et al. | ........................ | 257/737 |
| 2010/0072598 A1 * | 3/2010 | Oh et al. | ........................ | 257/686 |
| 2010/0102446 A1 * | 4/2010 | Katsurayama et al. | ........ | 257/738 |
| 2012/0139110 A1 * | 6/2012 | Jan et al. | ........................ | 257/738 |
| 2013/0026651 A1 * | 1/2013 | Oh et al. | ........................ | 257/774 |

FOREIGN PATENT DOCUMENTS

| | | |
|---|---|---|
| JP | 2008-218505 | 9/2008 |
| KR | 10-0800478 | 1/2008 |
| KR | 1020100051322 | 5/2010 |

* cited by examiner

*Primary Examiner* — Allan R Wilson
(74) *Attorney, Agent, or Firm* — F. Chau & Associates, LLC

(57) ABSTRACT

A semiconductor package apparatus includes a first semiconductor package including a first semiconductor chip, a first substrate, a first terminal, and a first signal transfer medium, and a second semiconductor package including a second semiconductor chip, a second substrate, a second terminal, and a second signal transfer medium. At least one package connecting solder ball is located between the first terminal and the second terminal. A first solder ball guide member is positioned around the first terminal of the first substrate and includes a first guide surface for guiding a shape of the package connecting solder ball.

20 Claims, 8 Drawing Sheets

SEMICONDUCTOR PACKAGE APPARATUS

CROSS-REFERENCE TO RELATED APPLICATION

This application claims the benefit of Korean Patent Application No. 10-2011-0052394, filed on May 31, 2011, in the Korean Intellectual Property Office, the disclosure of which is incorporated herein in its entirety by reference.

TECHNICAL FIELD

Embodiments of the inventive concept relate to a semiconductor package apparatus, and more particularly, to a package on package (POP) type semiconductor package apparatus capable of realizing a super-fine pitch between solder balls that connect the packages to each other.

DISCUSSION OF RELATED ART

In general, semiconductor package apparatuses are fabricated through processes of die-bonding a semiconductor chip on a surface of a member such as a lead frame or a printed circuit board (PCB), performing wire bonding or soldering in order to electrically connect a lead on the lead frame or terminals on the PCB to the semiconductor chip, and sealing the semiconductor chip by covering the semiconductor chip with an insulating sealing material.

SUMMARY

Embodiments of the inventive concept provide a semiconductor package apparatus realizing a super-fine pitch between solder balls by preventing soldering defects, such as an overflow of a solder ball to left and right sides thereof and a short between a first solder ball and a second solder ball, by guiding the solder balls in an up-and-down direction while the first solder ball of a first semiconductor package and the second solder ball of a second semiconductor package are connected to form one package connecting solder ball, when the first semiconductor package is stacked on the second semiconductor package.

According to an embodiment of the inventive concept, there is provided a semiconductor package apparatus including: a first semiconductor package including: a first semiconductor chip; a first substrate supporting the first semiconductor chip; at least one first terminal formed on the first substrate; and a first signal transfer medium electrically connecting the first semiconductor chip and the first terminal to each other; a second semiconductor package including: a second semiconductor chip; a second substrate supporting the second semiconductor chip; at least one second terminal formed on the second substrate; and a second signal transfer medium electrically connecting the second semiconductor chip and the second terminal to each other. The semiconductor package apparatus includes at least one package connecting solder ball between the first terminal and the second terminal for electrically connecting the first and second terminals to each other; and a first solder ball guide member around the first terminal of the first substrate and including first guide surfaces adjacent the package connecting solder ball for guiding a shape of the package connecting solder ball.

The first semiconductor package may be a package-on-package type that is stacked on the second semiconductor package.

The first signal transfer medium of the first semiconductor package may be a wire, and the first semiconductor package may further include: a sealing material covering the first semiconductor chip and the wire, wherein the sealing material protects the first semiconductor chip and the wire. The second semiconductor chip may be a flip-chip type, the second signal transfer medium of the second semiconductor package may be a chip solder ball or a bump, and the second semiconductor package may further include an underfill member covering the second semiconductor chip and protecting the second semiconductor chip.

The package connecting solder ball may include: a first solder ball on the first terminal; and a second solder ball on the second terminal and integrally connected to the first solder ball.

The first solder ball guide member may be a solder resist layer.

The solder resist layer may include: a first solder resist layer on the first substrate; and a second solder resist layer stacked on the first solder resist layer and including a different pattern or a different material from that of the first solder resist layer.

The first solder resist layer may be formed of a material that is resistant to a chemical etching or a laser etching operation, and the second solder resist layer may be formed of a material that is susceptible to the chemical etching or the laser etching operation.

The first guide surfaces of the first solder ball guide member may surround an opening in the first solder ball guide member. The first guide surfaces may be inclined, perpendicular, and/or positioned in a stepwise configuration with respect to the first substrate. Depending on the configuration of the first guide surfaces, a width of the opening may be reduced or increased with decreasing distance from the first terminal, be the same as or greater than that of the first terminal, and/or vary stepwise with decreasing distance from the first terminal.

The semiconductor package apparatus may further include a second solder ball guide member around the second terminal on the second substrate, and including second guide surfaces adjacent and guiding a shape of the package connecting solder ball.

The second guide surfaces of the second solder ball guide member may surround an opening in the second solder ball guide member, and may be inclined with respect to the second substrate. The opening in the second solder guide member may have a width that is gradually reduced with decreasing distance from the second terminal.

The second solder ball guide member may be a molded underfill member.

The semiconductor package apparatus may further include: a protrusion formed on the first solder ball guide member and a recess formed on the second solder ball guide member, or vice versa, wherein the protrusion and the recess are engaged with each other.

The semiconductor package apparatus may further include an isolator between the first solder ball guide member and the second solder ball guide member to electrically isolate neighboring package connecting solder balls from each other. The isolator may be formed of an insulating material, and an elastic material or a porous fiber material that is pressure fitted between the first solder ball guide member and the second solder ball guide member.

The semiconductor package apparatus may further include a solder ball inducing bar on each of the first terminal and the second terminal and formed to be elongated in an up-and-down direction (perpendicular to the first and second substrates) so as to prevent the package connecting solder ball formed to be long in the up-and-down direction from spreading to left and right sides. A flux layer is on the solder ball inducing bar.

According to an embodiment of the present inventive concept, there is a semiconductor package apparatus including: a first semiconductor package including: a first semiconductor chip; a first substrate supporting the first semiconductor chip; at least one first terminal formed on the first substrate; and a first signal transfer medium electrically connecting the first semiconductor chip and the first terminal to each other; and a second semiconductor package including: a second semiconductor chip; a second substrate supporting the second semiconductor chip; at least one second terminal formed on the second substrate; and a second signal transfer medium electrically connecting the second semiconductor chip and the second terminal to each other. At least one package connecting solder ball is located between the first terminal and the second terminal for electrically connecting the first and second terminals to each other. A solder resist layer is formed around the first terminal of the first substrate and includes a first guide surface adjacent and guiding a shape of the package connecting solder ball. A molded underfill member is installed around the second terminal of the second substrate and includes a second guide surface adjacent and guiding a shape of the package connecting solder ball.

A semiconductor package; according to an embodiment of inventive concept, comprises a substrate, a semiconductor chip on the substrate, at least one terminal formed on the substrate, at least one package connecting solder ball on the first terminal, and a solder resist layer formed on the substrate around the terminal, wherein the solder resist layer includes an opening in which the terminal and the package connecting solder ball are located.

A width of the opening may at least one of decrease with decreasing distance from the terminal, increase with decreasing distance from the terminal, and vary stepwise with decreasing distance from the terminal. A width of the opening may be greater than a width of the terminal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
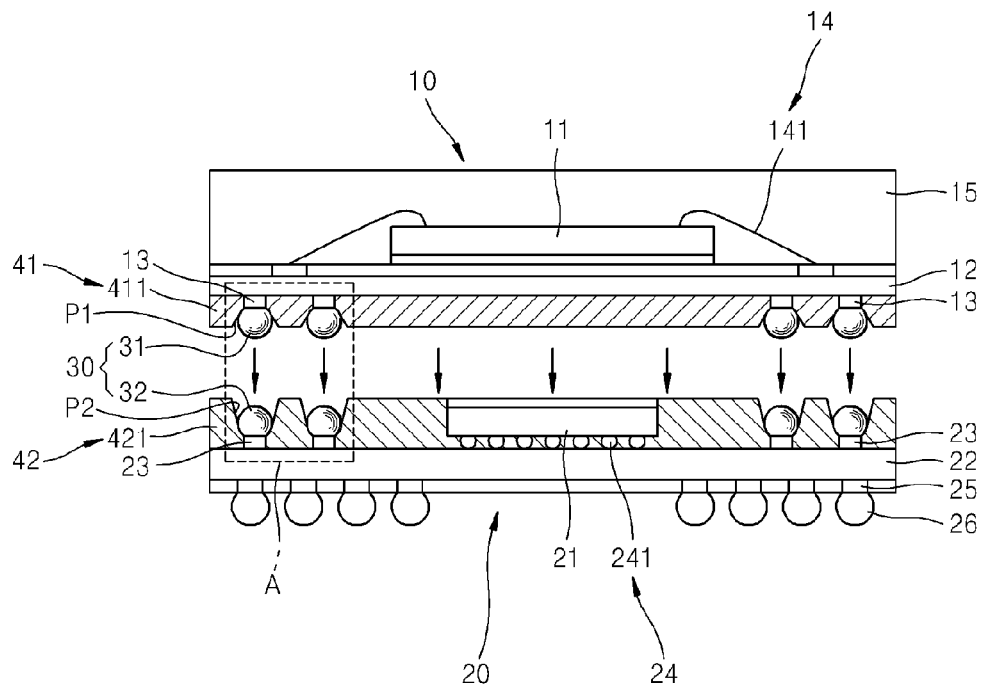
FIG. 1 is a cross-sectional view showing a separated state of a first semiconductor package and a second semiconductor package of a semiconductor package apparatus according to an embodiment of the present inventive concept.

Hereinafter, embodiments of the present inventive concept will be described in detail with reference to accompanying drawings.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein. In the drawings, the thicknesses of layers and regions may be exaggerated for clarity.

It will be understood that when an element or layer is referred to as being "on" another element or layer, the element or layer can be directly on another element or layer or intervening elements or layers. As used herein, the term "and/or" includes any and all combinations of one or more of the associated listed items.

As used herein, the singular forms "a", "an" and "the" are intended to include the plural forms as well, unless the context clearly indicates otherwise.

Figure 2:
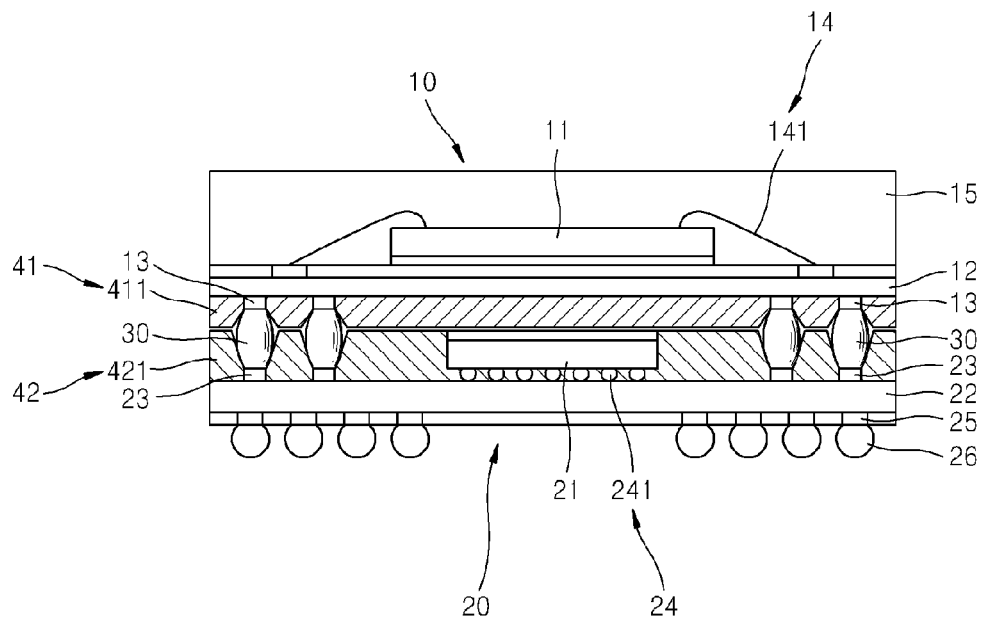
FIG. 2 is a cross-sectional view showing a stacked state of the first semiconductor package and the second semiconductor package of the semiconductor package apparatus of FIG. 1.
Figure 3:
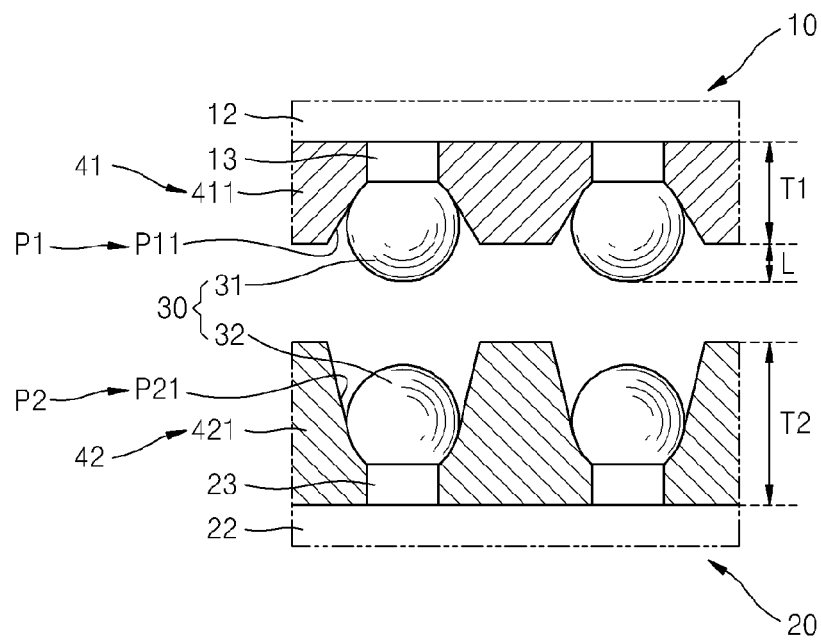
FIG. 3 is an expanded cross-sectional view of a part "A" shown in FIG. 1.

FIG. 1 is a cross-sectional view showing a separated state of a first semiconductor package 10 and a second semiconductor package 20 of a semiconductor package apparatus according to an embodiment of the present inventive concept, FIG. 2 is a cross-sectional view showing a stacked state of the first semiconductor package 10 and the second semiconductor package 20 in the semiconductor package apparatus of FIG. 1. FIG. 3 is an expanded cross-sectional view showing a part "A" of FIG. 1.

First, as illustrated in FIGS. 1 through 3, the semiconductor package apparatus according to the present embodiment includes the first semiconductor package 10, the second semiconductor package 20, package connecting solder balls 30, a first solder ball guide member 41, and a second solder ball guide member 42.

The first semiconductor package 10 includes a first semiconductor chip 11, a first substrate 12 supporting the first semiconductor chip 11, at least one first terminal 13 formed on the first substrate 12, a first signal transfer medium 14 electrically connecting the first semiconductor chip 11 to the first terminal 13, and a sealing material 15.

As shown in FIGS. 1 and 2, the first signal transfer medium 14 may include a wire 141. Otherwise, various types of signal transfer media such as a bump or a solder ball may be used as the first signal transfer medium 14.

The wire 141 is a semiconductor bonding wire, and may be formed of gold (Au), silver (Ag), platinum (Pt), aluminum (Al), copper (Cu), palladium (Pd), nickel (Ni), cobalt (Co), chrome (Cr), or titanium (Ti) by using a wire bonding device. In addition, a bump may be formed of Au, Ag, Pt, Al, Cu, or solder in a pulse plating method or a direct current (DC) electroplating method. A solder ball may be formed of lead (Pb), tin (Sn), an alloy of Pb and Sn, Ag, Cu, or Al by using a soldering device. However, the materials and forming methods of the wire 141, the bump, and the solder ball are not limited thereto.

The sealing material 15 covers the first semiconductor chip 11 and the wire 141 to protect the first semiconductor chip 11 and the wire 141, and may be formed of various synthetic resin materials including, for example, an epoxy resin, a hardener, and/or an organic/inorganic filling material and may be injection molded in a mold. The sealing material 15 may be a polymer such as a resin, for example, epoxy molding compound (EMC). However, the sealing material 15 of the embodiments of the present inventive concept is not limited thereto.

As shown in FIG. 1, in accordance with an embodiment of the inventive concept, the first semiconductor package 10 is stacked on the second semiconductor package 20.

The second semiconductor package 20 includes a second semiconductor chip 21, a second substrate 22 supporting the second semiconductor chip 21, at least one second terminal 23 formed on the second substrate 22, a second signal transfer medium 24 electrically connecting the second semiconductor chip 21 and the second terminal 23 to each other, and a molded underfill member 421.

In accordance with an embodiment of the inventive concept, the second semiconductor chip 21 is a flip-chip type, and the second signal transfer medium 24 of the second semiconductor package 20 may be a chip solder ball 241 or a bump. The molded underfill member 421 covers the second semiconductor chip 21 and protects the second semiconductor chip 21. The molded underfill member 421 may be injection molded in a mold by using various synthetic resin materials including, for example, an epoxy resin, a hardener, and/or an organic/inorganic filling material. The molded underfill member 421 may be formed of a polymer such as a resin, for example, EMC.

The molded underfill member 421 protects the chip solder ball 241 by covering the chip solder ball 241 during the injection molding process. The molding process and the underfill process for covering the chip solder ball 241 are simultaneously performed.

The chip solder ball 241 is positioned between the second semiconductor chip 21 and the second substrate 22, and electrically connects the second semiconductor chip 21 and the second substrate 22 to each other. The chip solder ball 241 may be formed of, for example, Pb, Sn, an alloy of Pb and Sn, Ag, Cu, or Al by using a soldering apparatus. The chip solder ball 241 is connected to a semiconductor chip, whereas the package connecting solder ball 30 is connected to a semiconductor package. As an alternative to the chip solder ball 241, a bump formed of Au, Ag, Pt, Al, Cu, or solder in a pulse plating method or a DC electroplating method may be installed on the second semiconductor chip 21. The bump formed of the solder material is referred to as a solder bump. However, the materials and forming methods of the molded underfill member 421 or the chip solder ball 241 are not limited to the above examples.

A package connecting solder ball 30 electrically connects the first semiconductor package 10 and the second semiconductor package 20 to each other, and fixes the first and second semiconductor packages 10 and 20 to each other. The package connecting solder ball 30 is positioned between the first and second terminals 13 and 23 so that the first and second terminals 13 and 23 are electrically connected to each other. A package connecting solder ball 30, as shown in FIG. 1, includes a first solder ball 31 on the first terminal 13 and a second solder ball 32 on the second terminal 23. The second solder ball 32 is separated from the first solder ball 31 when the first semiconductor package 10 and the second semiconductor package 20 are separated, that is, before being stacked. As shown in FIG. 2, when the first semiconductor package 10 and the second semiconductor package 20 are stacked, the first solder ball 31 and the second solder ball 32 are integrated as the package connecting solder ball 30 in a single body.

In accordance with embodiments of the inventive concept, the package connecting solder ball 30, the first solder ball 31, and the second solder ball 32 are not limited to solder that is an alloy of Pb and Sn, and are not limited to a ball shape. For example, the package connecting solder ball 30 may be formed of Pb, Sn, Ag, Cu, or Al, and may be formed in various shapes such as a cylinder, a polygonal pole, or a polyhedron. In addition, in accordance with an embodiment of the inventive concept, the package connecting solder ball 30 may be formed as a solder bump.

The first solder ball guide member 41 is positioned around the first terminal 13 of the first substrate 12, and includes a first guide surface P1 that guides the package connecting solder ball 30. In accordance with an embodiment of the inventive concept, the first solder ball guide member 41 is a solder resist layer 411. The solder resist layer 411 covers and protects a surface of a circuit layer formed of, for example, Au, Ag, Pt, Al, or Cu. The first substrate 12, for example, may include unsaturated carboxylic acid such as acrylic acid or an epoxy group and a resin compound having an unsaturated double bond, a light-sensitive photopolymer, a dye, and a hardening coating material. The first substrate 12 may be formed by being dried, developed by using an acid or alkaline solution, or etched by ultraviolet rays, infrared visible rays, or laser rays. The dye is for coloring the resin so as to prevent light absorption and a hardening phenomenon, thereby stabilizing the first substrate. The dye also makes the resin react to light of a certain wavelength so that laser light may be irradiated to a desired portion to perform selective etching.

As shown in FIG. 3, a thickness T1 of the solder resist layer 411 is formed to be sufficiently thick, for example, about 40 μm to about 100 μm, so that a sufficient contact area on which the first guide surface P1 contacts a side surface of the first solder ball 31 is created.

In accordance with an embodiment of the inventive concept, the thick solder resist layer 411 is formed by increasing viscosity of the solder resist solution when applying the solder resist layer 411, adjusting an application pressure or spray amount, and/or increasing the number of applications of the solder resist solution. For example, the solder resist solution is applied at least twice on the first substrate 12 according to the present embodiment.

The first solder ball 31 protrudes downward from the solder resist layer 411 to a predetermined length L to facilitate connection with the second solder ball 32.

Referring to FIG. 3, in accordance with an embodiment of the inventive concept, the first guide surface P1 of the first solder ball guide member 41 is an inclined surface P11. Due to the inclined surface P11, the width of the guide member 41 is reduced as the guide member 41 extends from the first terminal 13, and the width of space occupied by the solder ball is reduced as the inclined surface approaches the first terminal 13.

The inclined surface P11 is formed on the solder resist layer 411. For example, the inclined surface P11 may be etched on the solder resist layer 411 by acid or alkaline aqueous solution or by ultraviolet rays, infrared rays, or laser rays according to a material of the solder resist layer 411.

As shown in FIG. 3, the first solder ball 31 in a melted state can be massed as a ball on the first terminal 13 by a surface tension due to the inclined surface P11. As shown in FIGS. 4 through 14, a flux layer F can be formed on the first terminal 13 so as to improve a bonding property between the first terminal 13 and the first solder ball 31. The flux layer F also can be formed on the second terminal 23. In accordance with an embodiment of the inventive concept, the flux layer F removes an oxide layer on a surface of metal that is to be soldered and prevents the metal from re-oxidizing during the soldering operation. As a result, the surface tension of the melted solder is reduced, thereby improving the ability of to be spread and wetted. In addition, the flux layer F can be formed of a resin-based flux, for example, rosin-based flux.

As shown in FIGS. 1 through 3, a second solder ball guide member 42 is positioned around the second terminal 23 of the second substrate 23, and includes a second guide surface P2 for guiding the shape of the package connecting solder ball 30.

As shown in FIG. 3, the second solder ball guide member 42 can be a molded underfill member 421, and the second guide surface P2 of the second solder ball guide member 42 can be an inclined surface P21 that is formed on the molded underfill member 421. As shown in FIG. 3, the space in the underfill member 421, in which the solder ball 32 sits, has a width that is reduced as the inclined surface P21 extends toward the second terminal 23. Due to the presence of the inclined surface P21, as can be seen from FIG. 3, the width of the guide member 42 is greater as the guide member is closer to the second terminal 23.

As described above, the second semiconductor chip 21 can be a flip-chip type. The molded underfill member 421 covers the second semiconductor chip 21 and protects the second semiconductor chip 21. The molded underfill member 421 can be injection molded by using various synthetic resin materials including, for example, an epoxy resin, a hardening agent, and/or organic/inorganic filling materials. The molded underfill member 421 can be formed of a polymer such as a resin, for example, epoxy molding compound (EMC).

The inclined surface P21 can be formed by irradiating a laser on the surface of the molded underfill member 421. For example, the inclined surface P21 can be formed by penetrating the molded underfill member 421 in a laser drilling operation while adjusting the laser irradiation range or irradiating angle.

The inclined surface P21 can be formed in the molded underfill member 421, and can be perforated by the laser according to the material of the molded underfill member 421. Alternatively, the inclined surface P21 can be etched by an acid or alkaline aqueous solution or by ultraviolet rays or infrared visible rays. However, the embodiments of the present inventive concept are not limited to the above materials and forming methods of the molded underfill member 421 and the inclined surface P21.

Figure 13:
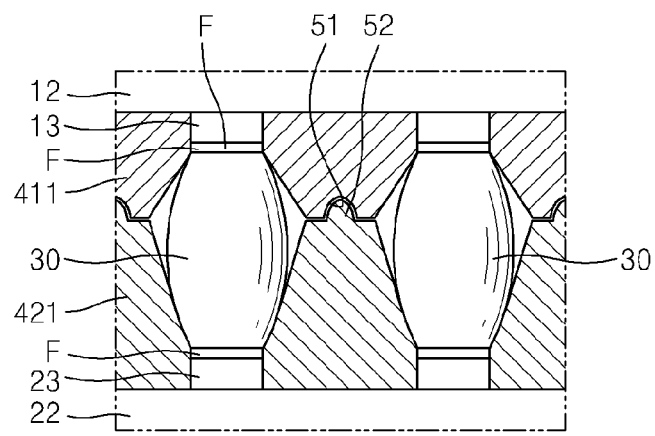
Figure 14:
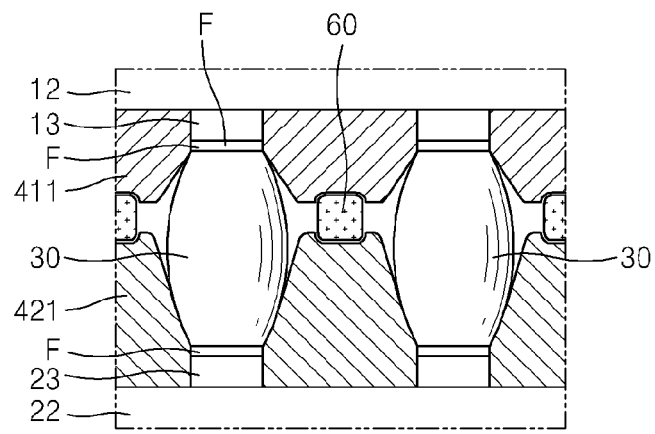

As shown in FIG. 3, the second solder ball 32 in a melted state can be massed as a ball on the second terminal 23 by a surface tension due to the inclined surface P21. As shown in FIGS. 13 and 14, a flux layer F can be formed on the second terminal 23 so as to improve bonding properties between the second terminal 23 and the second solder ball 32. In accordance with an embodiment of the inventive concept, the flux layer F removes an oxide layer on a surface of a metal that is to be soldered and prevents the metal from re-oxidizing during the soldering operation. As a result, the surface tension of the melted solder is reduced, thereby improving the ability of the solder to be spread and wetted. In addition, the flux layer F can be formed of a resin-based flux, for example, rosin-based flux.

In addition, as shown in FIG. 3, in accordance with an embodiment of the inventive concept, a thickness T2 of the molded underfill member 421 is formed to be sufficiently thick so that a sufficient contact area on which the second guide surface P2 contacts a side surface of the second solder ball 32 is created. The second solder ball 32 can be sufficiently set in the molded underfill member 421 so as not to spread or overflow due to the gravity, and contact neighboring solder balls.

Referring to FIGS. 1 and 2, external connecting solder balls 26 or bumps can be positioned on respective external connection terminals 25 on a lower surface of the second substrate 22 of the second semiconductor package 20 so as enable electrical connection to external devices, such as a main substrate or a board. An external connecting solder ball 26 is electrically connected to an external connecting terminal 25 and the external device, such as the main substrate (not shown) or the board. The external connecting solder ball 26 can be formed of Pb, Sn, an alloy of Pb and Sn, Ag, Cu, or Al by using a soldering device. The external connecting solder ball 26 is connected to the external devices, unlike the package connecting solder ball 30, which is connected between semiconductor packages. A bump that can be formed of Au, Ag, Pt, Al, Cu, or solder in a pulse plating method or a DC electroplating method can be positioned on the second semiconductor chip 21 instead of the external connecting solder ball 26. The bump formed of the solder material is referred to as a solder bump. The material and forming method of the external connecting solder ball 26 are not limited to the above described examples.

FIGS. 4 through 8 are enlarged cross-sectional views of part of a semiconductor package apparatus according to embodiments of the present inventive concept.

Figure 4:
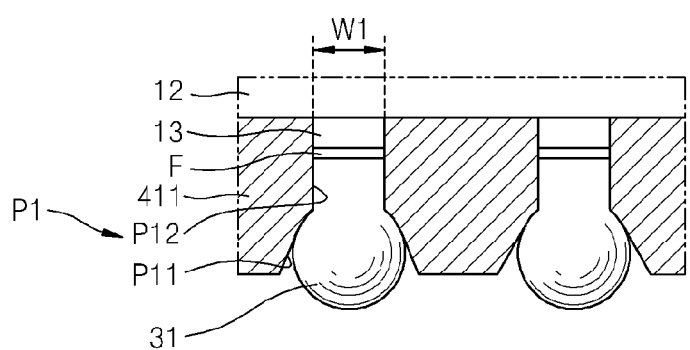
FIGS. 4 through 14 are expanded cross-sectional views of portions of semiconductor package apparatuses according to embodiments of the present inventive concept.

As shown in FIG. 4, in accordance with an embodiment of the inventive concept, the guide surface P1 can include both the inclined surface P11, which reduces a width of a space in which the solder ball 31 is placed as the inclined surface extends toward the first terminal, and a vertical wall surface P12 causing a width W1 that is constant and the same as that of the first terminal 13. The inclined surface P11 and the vertical wall surface P12 are formed in the solder resist layer 411. For example, the inclined surface P11 and the vertical wall surface P12 are etched by acid or alkaline aqueous solution or ultraviolet rays, infrared visible rays, or a laser according to the material of the solder resist layer 411.

In addition, as shown in FIGS. 4 through 14, the flux layer F can be formed on the first terminal 13 so as to improve bonding properties between the first terminal 13 and the first solder ball 31.

Referring to FIG. 4, a force for maintaining the ball-shape of the first solder ball 31 in the melted state is applied to the first solder ball 31 due to the surface tensions of the inclined surfaces P11 and the vertical wall surfaces P12. Also, the bonding of the first solder ball 31 to the first terminal 13 can be increased due to the flux layer F.

Figure 5:
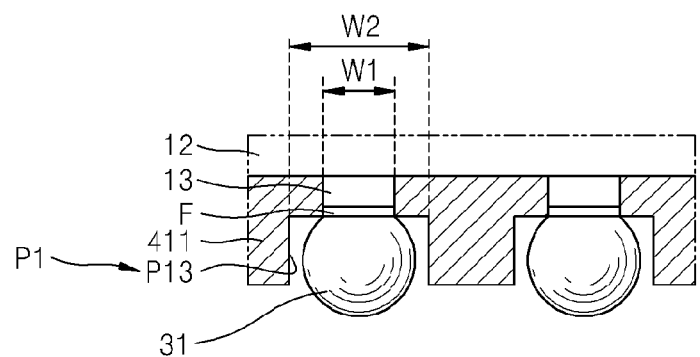

In accordance with an embodiment of the inventive concept, as shown in FIG. 5, the guide surface P1 may includes vertical wall surfaces P13 causing a width W2 of the opening in the solder resist layer 411 is greater than the width W1 of the first terminal 13. The vertical wall surfaces P13 are formed in the solder resist layer 411, for example, the vertical wall surfaces P13 are formed by etching the solder resist layer 411 by using acid or alkaline aqueous solution or ultraviolet ray, infrared visible ray, or a laser according to the material of the solder resist layer 411. The vertical wall surfaces P13 causing a width W2 that is greater than the width W1 of the first terminal 13 results in a sufficiently large space for receiving the first solder ball 31 so as to prevent the first solder ball 31 from contacting a neighboring first solder ball 31 due to overflow of the first solder ball 31.

Therefore, as shown in FIG. 5, due to the vertical wall surfaces P13, a force for maintaining the ball-shape of the first solder ball 31 in the melted state is applied to the first solder ball 31 by surface tension, and the first solder ball 31 is more securely bonded to the first terminal 13 due to the addition of the flux layer F. Moreover, if the capacity of the solder ball 31 exceeds a predetermined level, the overflow of the first solder ball 31 can be sufficiently contained by the vertical wall surface P13 having the width W2 that is greater than the width W1 of the first terminal 13, and thus preventing contact between the neighboring solder balls 31.

Figure 6:
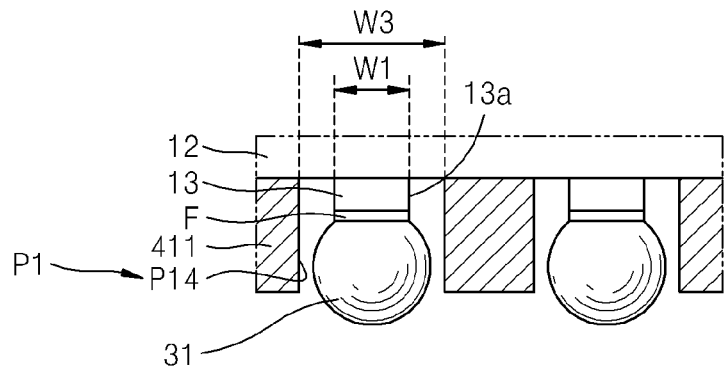

In accordance with an embodiment of the inventive concept, as shown in FIG. 6, the guide surface P1 includes vertical wall surfaces P14 causing a space in the solder resist layer 411 having a width W3 that is greater than the width W1 of the first terminal and exposing side surfaces 13a of the first terminal 13. The vertical wall surfaces P14 can be formed by etching the solder resist layer 411 by using acid or alkaline aqueous solution or ultraviolet rays, infrared visible rays, or a laser according to the material of the solder resist layer 411. The space between the vertical wall surfaces P14 having the width W3 that is greater than the width W1 of the first terminal 13 and exposing the side surfaces 13a of the first terminal 13 can result in a maximum space for receiving the first solder ball 31 so as to prevent contact between neighboring first solder balls 31 generated because the first solder ball 31 exceeds the capacity of the space and overflows.

Therefore, as shown in FIG. 6, due to the vertical wall surfaces P14, a force for maintaining the ball-shape of the first solder ball 31 in the melted state is applied to the first solder ball 31 by surface tension, and the first solder ball 31 is more securely bonded to the first terminal 13 due to addition of the flux layer F. In addition, if the capacity of the solder ball 31 exceeds a predetermined level, the overflow of the first solder ball 31 can be sufficiently contained by the vertical wall surface P14 having the width W3 that is greater than the width W1 of the first terminal 13, and thus preventing the contact between the neighboring solder balls 31.

Figure 7:
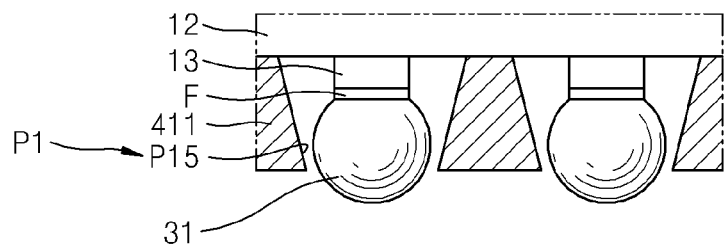

In accordance with an embodiment of the inventive concept, FIG. 7 shows a guide surface P1 that can receive overflow of the first solder ball 31 and prevent the contact between neighboring first solder balls 31, even if the first solder ball 31 exceeds regulated predetermined capacity. As shown in FIG. 7, inverse-inclined surfaces P15 result in a space in the solder resist layer 411 having a width that is gradually increased toward the first terminal 13. In accordance with an embodiment of the inventive concept, as shown in FIG. 8, inverse fault surfaces P16 resulting in a space in the solder resist layer 411 having a width that is increased stepwise toward the first terminal 13 can be formed.

Figure 8:
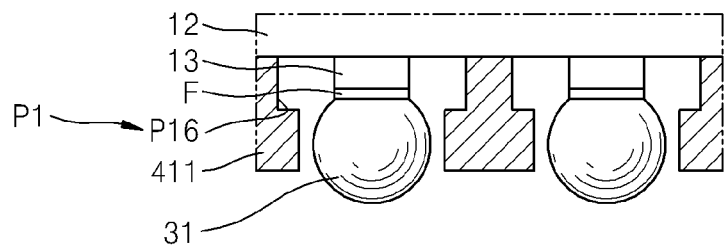

The inverse inclined surface P15 of FIG. 7 or the inverse fault surface P16 of FIG. 8 can be formed in the solder resist layer 411, for example, by etching the solder resist layer 411 by using acid or alkaline aqueous solution or ultraviolet rays, infrared visible rays, or a laser according to the material of the solder resist layer 411. In particular, when the etching is performed by using a laser, the inverse inclined surface P15 or the inverse fault surface P16 can be formed by adjusting a focal depth of the laser, irradiating angle, irradiating amount, or irradiating time of the laser. For example, if the focal depth of the laser is located at a deep point with respect to the surface of the solder resist layer 411, the deep portion of the solder resist layer 411 can be etched more than at the surface of the solder resist layer 411.

Therefore, in accordance with an embodiment of the inventive concept, the inverse inclined surface P15 or the inverse fault surface P16 can provide a maximum space for receiving the first solder ball 31 so that contact between two neighboring first solder balls 31 caused due to overflowing of the first solder ball 31 can be prevented. It is to be understood that the configuration of the guide surface P1 is not limited to the above examples.

FIGS. 9 through 12 are expanded cross-sectional views of portions of semiconductor package apparatuses according to embodiments of the present inventive concept.

Figure 9:
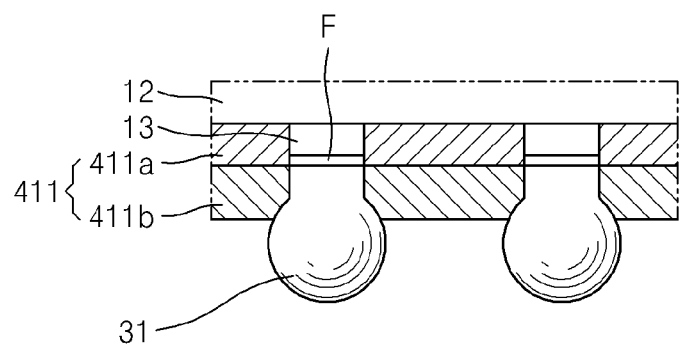

Referring to FIG. 9, the solder resist layer 411 includes at least two or more layers, for example, a first solder resist layer 411a and a second solder resist layer 411b. The first solder resist layer 411a is positioned on the first substrate 12, and the second solder resist layer 411b is stacked on the first solder resist layer 411b and can be formed of a material different from that of the first solder resist layer 411b, and in a different pattern from that of the first solder resist layer 411a.

Figure 10:
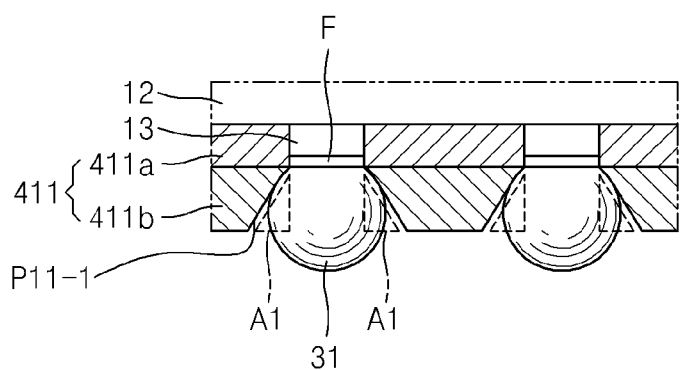

Referring to FIG. 10, the first solder resist layer 411a can be formed of a material that is resistant to etching such as, chemical etching or a laser etching, and the second solder resist layer 411b can be formed of a material that is susceptible to etching.

Therefore, for example, if the second solder resist layer 411b is etched by chemical or laser etching to etch a region A1 denoted by a dotted line, inclined surfaces P11-1 that are similar to the inclined surfaces P11 shown in FIG. 3 resulting in a space having a width that is gradually reduced toward the first terminal 13 can be formed without damaging the first solder resist layer 411a.

Figure 11:
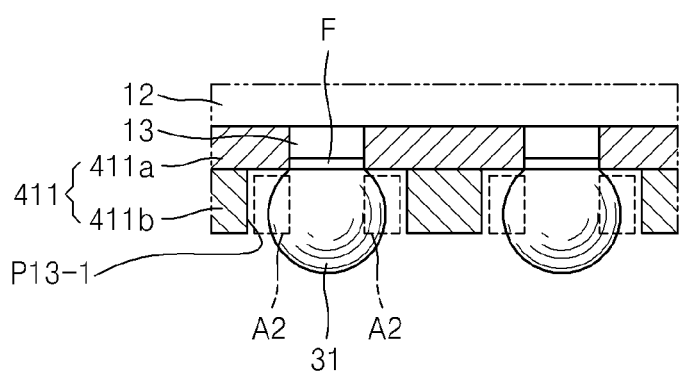

In accordance with an embodiment of the inventive concept, as shown in FIG. 11, if the second solder resist layer 411b is etched by chemical or laser etching to etch a region A2 denoted by a dotted line, vertical wall surfaces P13-1 that are similar to the vertical wall surfaces P13 shown in FIG. 5 resulting in a space having a width W2 that is greater than that of the first terminal 13 can be formed without damaging the first solder resist layer 411a.

Figure 12:
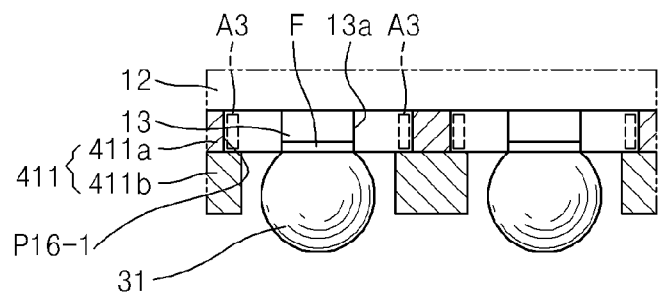

In accordance with an embodiment of the inventive concept, as shown in FIG. 12, the first solder resist layer 411a can be formed of a material that is susceptible to etching, and the second solder resist layer 411b can be formed of a material that is resistant to etching. When the first solder resist layer 411a is etched by chemical or laser etching to etch a region A3 denoted by a dotted line, inverse fault surfaces P16-1 that are similar to the inverse fault surfaces P16 shown in FIG. 8 which result in a space having a width W3 that is greater than that of the first terminal 13, are formed. The resulting space exposes the side surfaces 13a of the first terminal 13, and has the width that is increased stepwise toward the first terminal 13. The resulting space can be formed without damaging the second solder resist layer 411b.

FIG. 13 is an expanded cross-sectional view of part of a semiconductor package apparatus according to an embodiment of the present inventive concept.

As shown in FIG. 13, the semiconductor package apparatus according to the present embodiment further includes a protrusion 52 and a recess 51 which are respectively formed in the first solder ball guide member 41 and the second solder ball guide member 42, so that the protrusion 52 and the recess 51 can be engaged with each other. In accordance with embodiments of the inventive concept, the protrusion 52 and the recess 51 can be formed in various shapes that are engaged with each other. For example, as an alternative to the protrusion 52 and the recess 51 having round cross-sections as shown in FIG. 13, protrusions and recesses having, for example, triangular shapes, polygonal shapes, cylindrical shapes, trapezoidal shapes, and tooth-shapes, can be used. Therefore, the protrusion 52 and the recess 51 are engaged, for example in a pressure fit, with each other to block a gap therebetween, and thus, contact between the neighboring package connecting solder balls 30 can be further prevented.

FIG. 14 is an expanded cross-sectional view of a portion of a semiconductor package apparatus according to an embodiment of the present inventive concept.

As shown in FIG. 14, in the semiconductor package apparatus of the present embodiment, an isolator 60 is further formed on the first and second solder ball guide members 41 and 42 for electrically isolating neighboring package connecting solder balls 30 from each other. In accordance with an embodiment of the inventive concept, the isolator 60 is formed of an insulating material, for example, an elastic material such as rubber or resin, or a porous fiber material that is engaged, for example, in a pressure fit, between the first and second solder ball guide members 41 and 42. As a result, the isolator 60 blocks a gap between the first and second solder ball guide members 41 and 42 so that neighboring package connecting solder ball 30 do not contact each other.

Figure 15:
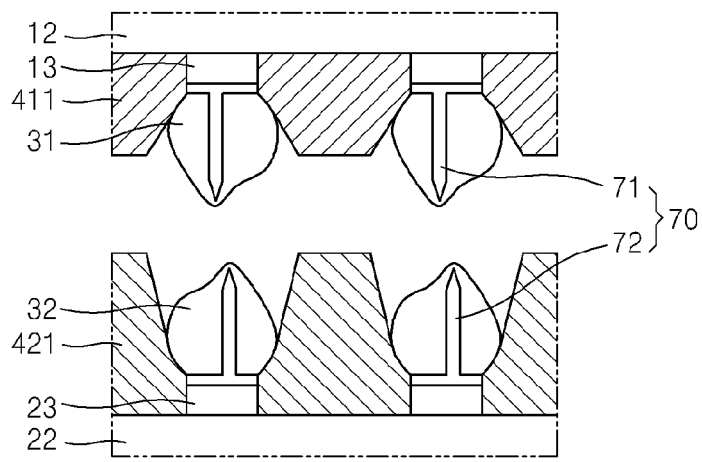
FIG. 15 is an expanded perspective view showing a separates state of part of a first semiconductor package and part of a second semiconductor package of a semiconductor package apparatus according to an embodiment of the present inventive concept.
Figure 16:
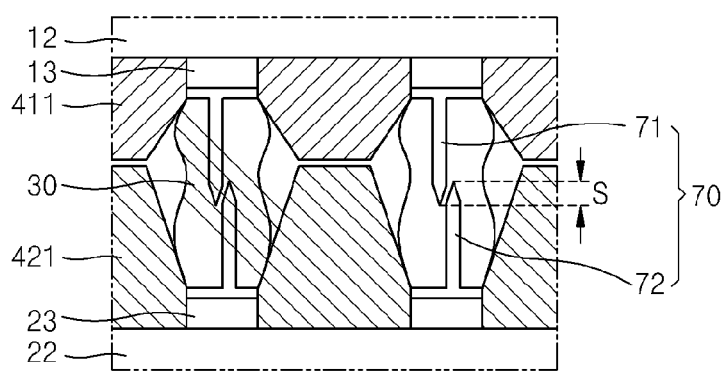
FIG. 16 is an expanded perspective view showing a stacked state of the part of the first semiconductor package and the part of the second semiconductor package of the semiconductor package apparatus of FIG. 15.
Figure 17:
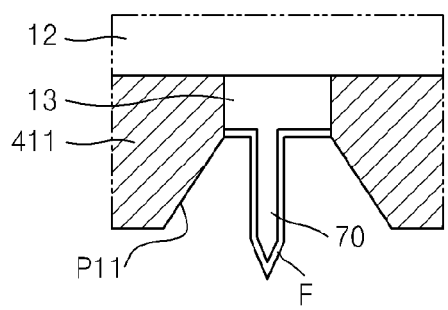
FIG. 17 is an expanded cross-sectional view of a solder ball guide bar shown in FIG. 15.

FIG. 15 is an expanded cross-sectional view of a portion of a semiconductor package apparatus according to an embodiment of the present inventive concept in a state where the first semiconductor package 10 and the second semiconductor package 20 are separated. FIG. 16 is an expanded cross-sectional view of the semiconductor package apparatus of FIG. 15 where the first and second semiconductor packages 10 and 20 are stacked. FIG. 17 is an expanded cross-sectional view of an example of a solder ball inducing bar 70 shown in FIG. 15.

As shown in FIGS. 15 through 17, the semiconductor package apparatus according to the present embodiment further includes the solder ball inducing bar 70, on which a flux layer F is applied, to prevent the package connecting solder ball 30, which is elongated in the up-and-down direction, from spreading to left and right sides. Solder ball inducing bars 70 are respectively installed on the first terminal 13 and the second terminal 23, and are elongated in the up-and-down direction.

In addition, as shown in FIGS. 15 and 16, the solder ball inducing bars 70 include a first solder ball inducing bar 71 installed on the first terminal 13 and having a sharp front edge, and a second solder ball inducing bar 72 that is installed on the second terminal 23 and has a sharp front edge. The second solder ball inducing bar 72 is offset from the first solder ball inducing bar 71. The first and second solder ball inducing bars 71 and 72 have the sharp front edges that do not contact each other. In addition, when the first and second semiconductor packages 10 and 20 are stacked, due to the sharp/pointed leading edges, the first solder ball inducing bar 71 can penetrate into the second solder ball 32, and the second solder ball inducing bar 72 can penetrate into the first solder ball 31.

In addition, as shown in FIG. 16, when the first semiconductor package 10 is stacked on the second semiconductor package 20, the first and second solder ball inducing bars 71 and 72 can be formed to be sufficiently long so that the solder ball inducing bars 71, 72 overlap each other at a predetermined areas S. As shown in FIG. 17, the flux layer F is applied on a surface of the solder ball inducing bar 70 so as to improve the ability of the package connecting solder ball 30 as shown in FIG. 16 to be wetted. As a result, defective connections or shorts between the first and second solder balls 31 and 32 can be prevented.

In accordance with an embodiment of the inventive concept, the solder ball inducing bar 70 can be formed of Au, Ag, Pt, Al, Cu, or solder in a bonding process, an etching process, or a plating process, such as pulse plating or DC electroplating. The materials and the forming methods of the solder ball inducing bars 70 are not limited to the above examples.

Figure 18:
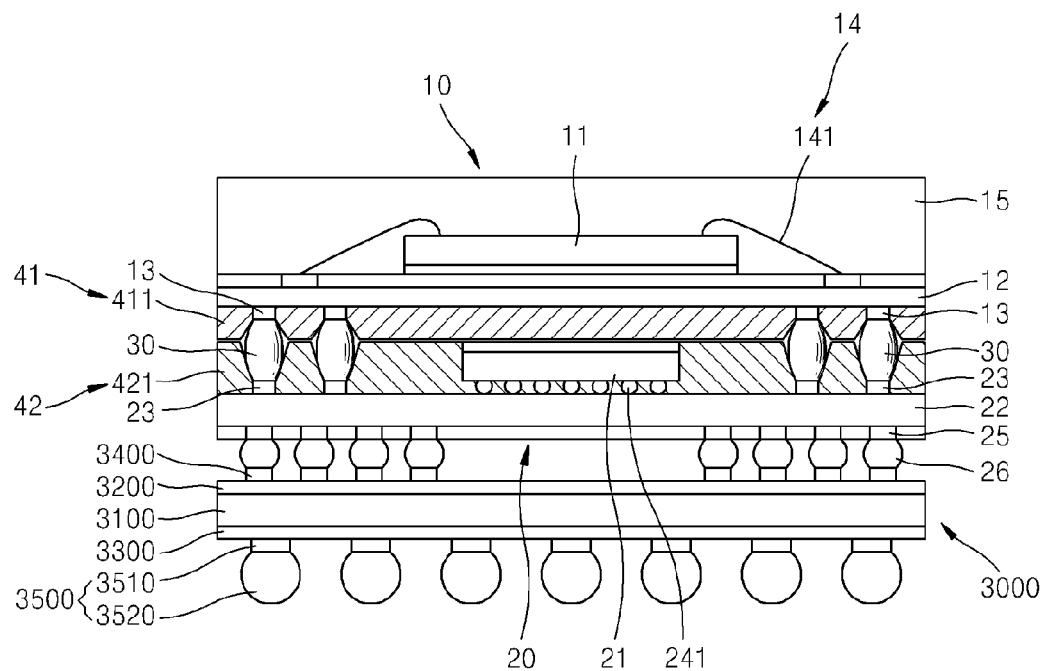
FIG. 18 is a cross-sectional view of a semiconductor package apparatus according to an embodiment of the present inventive concept.

FIG. 18 is a cross-sectional view of a semiconductor package apparatus according to an embodiment of the present inventive concept.

The semiconductor package apparatus of FIG. 18 can have a similar structure to that of the semiconductor package apparatus of FIG. 2. For example, the first semiconductor package 10, the second semiconductor package 20, the package connecting solder ball 30, the first solder ball guide member 41, and the second solder ball guide member 42 can have the same structures as those shown in FIGS. 1 through 3. The first semiconductor package 10 and the second semiconductor package 20 are mounted on a board substrate 3000 via the external connecting solder balls 26.

Figure 19:
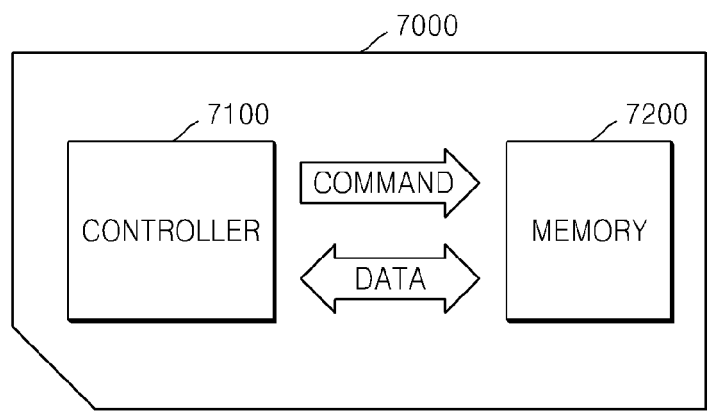
FIG. 19 is a block diagram of a memory card including a semiconductor package apparatus according to an embodiment of the present inventive concept.

The board substrate 3000 includes a body layer 3100, an upper protective layer 3200, a lower protective layer 3300, upper pads 3400, and external connecting members 3500. In accordance with an embodiment of the inventive concept, the body layer 3100 includes a plurality of wiring patterns. The upper and lower protective layers 3200 and 3300 protect the body layer 3300, which is, for example, a solder resist layer. The board substrate 3000 can be, for example, a module board or a main board in computers or various electronic devices. In addition, the board substrate 3000 may be standardized and there may be limitations in reducing a size of the board substrate 3000. FIG. 19 is a block diagram of a memory card including a semiconductor package apparatus according to an embodiment of the present inventive concept.

Referring to FIG. 19, a controller 7100 and a memory 7200 in the memory card 7000 can be arranged to exchange electric signals with each other. For example, when the controller 7100 issues a command, the memory 7200 can transfer the data. The controller 7100 and/or the memory 7200 may include a semiconductor package apparatus according to at least one of the embodiments of the present inventive concept. The memory 7200 can include, for example, a memory array (not shown) or a memory array bank (not shown).

The memory card 7000 can be used in various devices, for example, in a memory device such as a memory stick card, a smart media card (SM), a secure digital (SD) card, a mini secure digital card (mini SD), or a multi media card (MMC).

Figure 20:
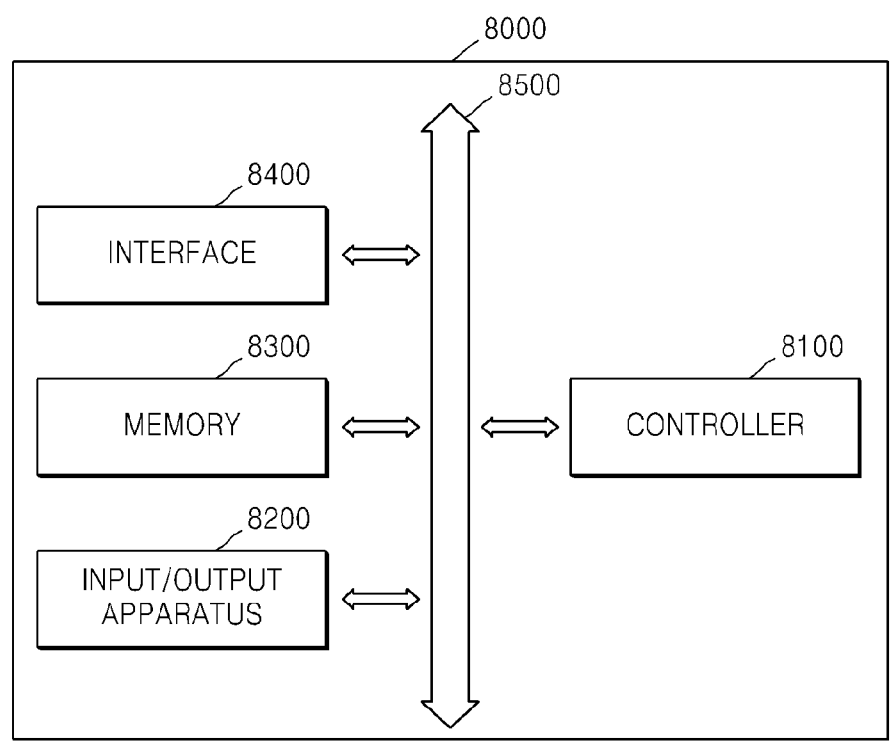
FIG. 20 is a schematic block diagram of an electronic system including a semiconductor package apparatus according to an embodiment of the present inventive concept.

FIG. 20 is a block diagram of an electronic system including a semiconductor package apparatus according to an embodiment of the present inventive concept.

Referring to FIG. 20, an electronic system 8000 includes a controller 8100, an input/output apparatus 8200, a memory 8300, and an interface 8400. The electronic system 8000 can be, for example, a mobile system or a system transmitting or receiving information. The mobile system can be, for example, a personal digital assistant (PDA), a portable computer, a web tablet, a wireless phone, a mobile phone, a digital music player, or a memory card.

The controller 8100 can execute a program and control the electronic system 8000. The controller 8100 can be, for example, a microprocessor, a digital signal processor, a microcontroller, or a similar device. The input/output apparatus 8200 can be used to input or output data into/from the electronic system 8000.

The electronic system 8000 can be connected to an external device, for example, a personal computer or a network, by using the input/output apparatus 8200, to exchange data with the external device. The input/output apparatus 8200 can be, for example, a keypad, a keyboard, or a display. The memory 8300 stores codes and/or data for operating the controller 8100, and/or can store data processed by the controller 8100. The controller 8100 and the memory 8300 can include a semiconductor package apparatus according to at least one of the embodiments of the present inventive concept. The interface 8400 may be a transmission path between the system 8000 and another device. The controller 8100, the input/output apparatus 8200, the memory 8300, and the interface 8400 can communicate with each other via a bus 8500.

For example, the electronic system 8000 can be used in a mobile phone, an MP3 player, a navigation device, a portable multimedia player (PMP), a solid state disk (SSD), or household appliances.

While the inventive concept has been particularly shown and described with reference to exemplary embodiments thereof, it will be understood that various changes in form and details may be made therein without departing from the spirit and scope as set forth in the following claims.

What is claimed is:

1. A semiconductor package apparatus comprising:
    a first semiconductor package comprising:
        a first substrate;
        a first semiconductor chip on the first substrate;
        at least one first terminal formed on the first substrate; and
        a first signal transfer medium electrically connecting the first semiconductor chip and the first terminal to each other;
    a second semiconductor package comprising:
        a second substrate;
        a second semiconductor chip on the second substrate;
        at least one second terminal formed on the second substrate; and
        a second signal transfer medium electrically connecting the second semiconductor chip and the second terminal to each other;
    at least one package connecting solder ball between the first terminal and the second terminal for electrically connecting the first and second terminals to each other;
    a first solder ball guide member around the first terminal of the first substrate and including inclined first guide surfaces adjacent the package connecting solder ball; and
    a second solder ball guide member around the second terminal of the second substrate and including inclined second guide surfaces adjacent the package connecting solder ball, wherein the first solder ball guide member has a thickness that is less than a thickness of the second solder ball guide member, and the first solder ball guide member contacts the second solder ball guide member.

2. The semiconductor package apparatus of claim 1, wherein the first semiconductor package is stacked on the second semiconductor package.

3. The semiconductor package apparatus of claim 1, wherein the first signal transfer medium is a wire, the first semiconductor package further comprises: a sealing material covering the first semiconductor chip and the wire, the second semiconductor chip is a flip-chip type, the second signal transfer medium is a chip solder ball or a bump, and the second semiconductor package further comprises an underfill member covering the second semiconductor chip.

4. The semiconductor package apparatus of claim 1, wherein the package connecting solder ball comprises:
    a first solder ball on the first terminal; and
    a second solder ball on the second terminal and integrally connected to the first solder ball.

5. The semiconductor package apparatus of claim 1, wherein the first solder ball guide member is a solder resist layer.

6. The semiconductor package apparatus of claim 5, wherein the solder resist layer comprises:
    a first solder resist layer on the first substrate; and
    a second solder resist layer on the first solder resist layer and including a different pattern or a different material from that of the first solder resist layer.

7. The semiconductor package apparatus of claim 6, wherein the first solder resist layer is formed of a material that is resistant to an etching operation, and the second solder resist layer is formed of a material that is susceptible to an etching operation.

8. The semiconductor package apparatus of claim 1, wherein the first guide surfaces of the first solder ball guide member surround an opening in the first solder ball guide member, the first guide surfaces are inclined with respect to the first substrate, and a width of the opening is reduced with decreasing distance from the first terminal.

9. The semiconductor package apparatus of claim 1, wherein the first guide surfaces of the first solder ball guide member surround an opening in the first solder ball guide member, the first guide surfaces are perpendicular with respect to the first substrate, and a width of the opening is the same as that of the first terminal, or greater than that of the first terminal and exposing side surfaces of the first terminal.

10. The semiconductor package apparatus of claim 1, wherein the first guide surfaces of the first solder ball guide member surround an opening in the first solder ball guide member, the first guide surfaces are inclined with respect to the first substrate, and a width of the opening is increased with decreasing distance from the first terminal.

11. The semiconductor package apparatus of claim 1, wherein the first guide surfaces of the first solder ball guide member surround an opening in the first solder ball guide member, the first guide surfaces are positioned in a stepwise configuration so that a width of the opening is increased stepwise with decreasing distance from the first terminal.

12. The semiconductor package apparatus of claim 1, further comprising a second solder ball guide member around the second terminal on the second substrate, and including second guide surfaces adjacent the package connecting solder ball.

13. The semiconductor package apparatus of claim 12, wherein the second guide surfaces of the second solder ball guide member surround an opening in the second solder ball guide member, the second guide surfaces are inclined with respect to the second substrate, and a width of the opening is reduced with decreasing distance from the second terminal.

14. The semiconductor package apparatus of claim 12, wherein the second solder ball guide member is an underfill member.

15. The semiconductor package apparatus of claim 12, further comprising: a protrusion and a recess, or a recess and a protrusion respectively formed on the first solder ball guide member and the second solder ball guide member, wherein the protrusion and the recess engage with each other.

16. The semiconductor package apparatus of claim 12, further comprising an isolator between the first solder ball guide member and the second solder ball guide member to electrically isolate neighboring package connecting solder balls from each other,
    wherein the isolator includes an insulating material, and an elastic material or a porous fiber material that is pressure fitted between the first solder ball guide member and the second solder ball guide member.

17. The semiconductor package apparatus of claim 1, further comprising a solder ball inducing bar on each of the first terminal and the second terminal, wherein the solder ball inducing bar is elongated in a direction perpendicular to the first and second substrates, and wherein a flux layer is on the solder ball inducing bar.

18. A semiconductor package apparatus comprising:
a first semiconductor package comprising:
a first substrate;
a first semiconductor chip on the first substrate;
at least one first terminal formed on the first substrate; and
a first signal transfer medium electrically connecting the first semiconductor chip and the first terminal to each other;
a second semiconductor package comprising:
a second substrate;
a second semiconductor chip on the second substrate;
at least one second terminal formed on the second substrate; and
a second signal transfer medium electrically connecting the second semiconductor chip and the second terminal to each other;
at least one package connecting solder ball between the first terminal and the second terminal for electrically connecting the first and second terminals to each other;
a solder resist layer formed around the first terminal of the first substrate and including an inclined first guide surface adjacent the package connecting solder ball; and
an underfill member installed around the second terminal of the second substrate and including an inclined second guide surface adjacent the package connecting solder ball, wherein the solder resist layer has a thickness that is less than a thickness of the underfill member, and the solder resist layer contacts the underfill member.

19. A semiconductor package comprising:
a substrate;
a semiconductor chip on the substrate;
at least one terminal formed on the substrate;
at least one package connecting solder ball on the terminal; and
an underfill member formed on the substrate around the terminal, wherein the underfill member includes an inclined opening in which the terminal and the package connecting solder ball are located, and wherein the underfill member contacts a solder resist layer that surrounds a upper portion of the package connecting solder ball, and the solder resist layer has a thickness that is less than a thickness of the underfill member.

20. The semiconductor package of claim 19, wherein a width of the opening at least one of decreases with decreasing distance from the terminal, increases with decreasing distance from the terminal, and varies stepwise with decreasing distance from the terminal.

* * * * *